(12) United States Patent
Rudish (10) Patent No.: US 6,411,076 B1
(45) Date of Patent: Jun. 25, 2002

(54) METHOD FOR MINIMIZING THE NUMBER OF DELAY LINES REQUIRED IN INSTANTANEOUS FREQUENCY MEASUREMENT RECEIVERS AND APPARATUS WHICH USES SAME

(75) Inventor: Ronald M. Rudish, Commack, NY (US)

(73) Assignee: AIL Systems, Inc., Deer Park, NY (US)

( * ) Notice: Subject to any disclaimer, the term of this patent is extended or adjusted under 35 U.S.C. 154(b) by 0 days.

(21) Appl. No.: 09/335,406

(22) Filed: Jun. 17, 1999

(51) Int. Cl.[7] ............................................. G01R 23/175
(52) U.S. Cl. .................................................... 324/76.54
(58) Field of Search ......................... 324/76.54, 76.35, 324/76.19, 76.47, 76.77, 76.82, 76.23, 76.55; 702/122, 79, 72; 342/13, 423, 424, 445, 422; 327/7; 250/227.12, 227.21

(56) References Cited

U.S. PATENT DOCUMENTS 3,939,411 A * 2/1976 James ....................... 324/77 H
4,963,816 A * 10/1990 Tsui et al. ................ 324/77 H
6,198,436 B1 * 3/2001 Rudish ........................ 342/424

OTHER PUBLICATIONS

Tsui, J., "Instantaneous Frequency Measurement (IFM) Receivers", *Wiley Insterscience*, pp.197–199 (1986).

Tsui, J., "Microwave Receivers and Related Components", *NTIS*, Springfield, VA, Report No. PB84–108711, pp.75–76 (1983).

Dr. D. Curtis Schleher, "Introduction to Electronic Warfare", *Artech House*, Dedham, MA, pp.64–69 (1986).

* cited by examiner

Primary Examiner—N. Le
Assistant Examiner—Etienne P LeRoux
(74) Attorney, Agent, or Firm—Hoffman & Baron, LLP (57) ABSTRACT

An Instantaneous Frequency Measurement (IFM) receiver that receives a signal from a target and determines the frequency of the signal. The IFM receiver includes delay lines selected in lengths forming relatively prime ratios or by using the preferred method of the present invention which minimizes the total number of different delays required to achieve a given accuracy in frequency measurement.

13 Claims, 8 Drawing Sheets

METHOD FOR MINIMIZING THE NUMBER OF DELAY LINES REQUIRED IN INSTANTANEOUS FREQUENCY MEASUREMENT RECEIVERS AND APPARATUS WHICH USES SAME

BACKGROUND OF THE INVENTION

The present invention relates generally to Electronic Surveillance Measurement (ESM) receivers such as Instantaneous Frequency Measurement (IFM) receivers, and more particularly relates to the selection of delays in IFM receivers to minimize the quantity of delay lines required to achieve a given accuracy.

DESCRIPTION OF THE PRIOR ART

Figure 1:
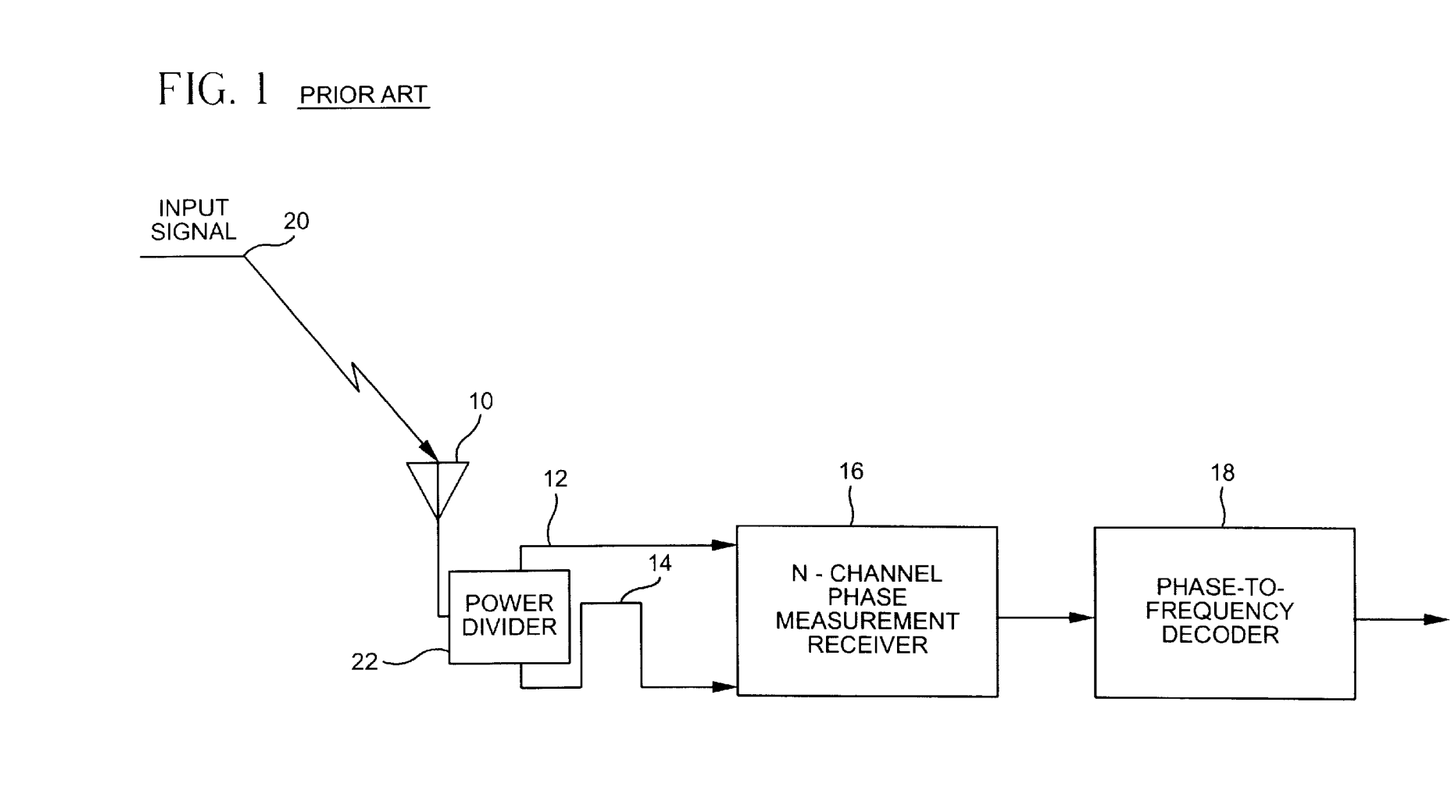
FIG. 1 is a block diagram of an Instantaneous Frequency Measurement (IFM) receiver of the prior art.

Electronic Surveillance Measurement (ESM) receivers commonly require that frequency calculations be performed on an input signal from targets of interest. The frequency of the input signal is often measured using an Instantaneous Frequency Measurement (IFM) receiver as illustrated in FIG. 1. The IFM receiver uses a difference in phase between a delayed and a non-delayed version of the input signal to calculate the frequency of the input signal.

The IFM receiver is the simplest, most mature technique for obtaining accurate pule-by-pulse frequency information over a broad frequency band. Accurate frequency information is required for a variety of purposes in ESM receivers. For instance, it is useful as a sorting parameter for de-interleaving multiple emitters in a dense environment, being second only to angle-of-arrival in the hierarchy of sorting parameters. An additional role is in active power-managed ECM systems to define the band of jamming response, thereby optimizing utilization of jamming power and maximizing jamming effectiveness. Further, IFM receivers are useful in the detection and display of frequency-agile and pulse compression radar emitters.

The IFM receiver illustrated in FIG. 1 includes a receptor element or antenna 10, a power divider 22, a reference delay line 12, one or more differential delay lines 14, an N-channel phase measurement receiver 16, and a phase-to-frequency decoder 18. An input signal 20 is received and split into two or more constituent signals by the power divider 22. One constituent signal is applied to the reference delay line 12, and the remaining constituent signals are applied to the differential delay lines 14. The delayed signals are then applied to separate channels of the N-channel phase measurement receiver 16. The difference in delay between the reference delay line 12 and the differential delay lines 14 causes a frequency dependent phase shift, which is measured by the N-channel phase measurement receiver 16. The frequency of the input signal 20 is determined from this phase shift by the phase-to-frequency decoder 18.

Phase measurement receivers are alternatively referred to as phase discriminators, phase correlators or quadrature mixers. Further detail regarding phase measurement receivers can be found in a product specification catalog entitled, *Anaren RF & Microwave Components,* February 1997, distributed by Anaren Microwave, Inc., 6635 Kirkville Road, East Syracuse, New York 13057, the pertinent portions of which are incorporated herein by reference.

The phase shift or difference ψ radians (relative to the path through the reference delay line 12), which is created by a delay difference τ seconds (relative to the same path through the reference delay line 12) at a frequency f hertz, is given by equation (1) as follows:

$$\psi = 2\pi\tau f, \qquad (1)$$

and thus $$f = \psi/2\pi\tau, \qquad (2)$$

where $\tau = \Delta l/c$ is the delay difference in seconds $\Delta l$ is a length differential between the delay lines, and c is a velocity of propagation in the delay lines.

A measured phase difference $\phi_{meas}$ will differ from the phase difference ψ due to measurement error and the inability to measure phase values outside a range of 2π. For example, assume that the phase is measured with a phase receiver having a random phase measurement error ε degrees at a particular signal-to-noise ratio, and that bias error is removed by calibration. The measured phase difference $\phi_{meas}$ that results is given by equation (3) as follows:

$$\phi_{meas} = \text{MOD}_{2\pi}(2\pi\tau f + E), \qquad (3)$$

where E is a random variable with a standard deviation equal to the phase measurement error ε and a mean of zero.

Using a large value for the delay difference τ produces a large phase difference slope with frequency, which minimizes the phase measurement error ε caused by E. This translates to a more accurate determination of frequency. Specifically, with a phase receiver having the phase measurement error ε degrees, a frequency error Δf hertz, standard deviation, is given by equation (4) as follows:

$$\Delta f = (\epsilon/360)(1/\tau). \qquad (4)$$

For example, with the delay difference τ equal to 5 nanoseconds, and the phase measurement error ε equal to 7.2 degrees, the IFM receiver is capable of a frequency measurement with the frequency error Δf equal to 4 MHZ.

However, $\phi_{meas}$, and thus a measured frequency $f_{meas}$, is ambiguous for values of τf which are greater than unity because phase can only be determined nonambiguously within a range of 2π. In fact, multiple ambiguities will be spaced at intervals of frequency equal to 1/τ. For the example above, τf is greater than unity for f>0.2 Ghz, and ambiguities occur every 0.2 Ghz. In other words, the output of the phase receiver is identical for input frequencies of 0.05 Ghz, 0.25 Ghz, 0.45 Ghz, and so forth.

Figure 2:
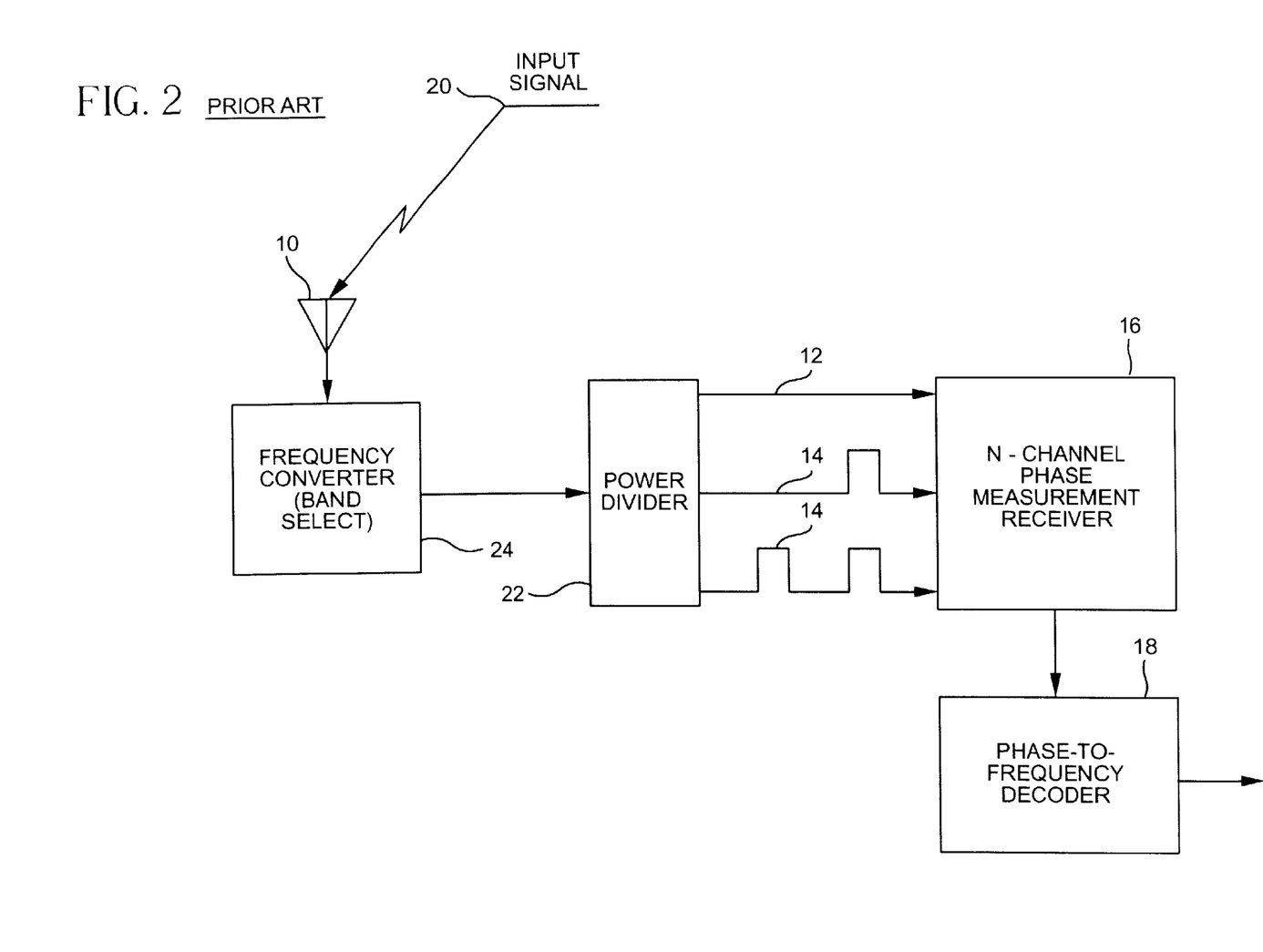
FIG. 2 is a block diagram of a conventional IFM receiver, which operates on input signals in one frequency band at a time.

To measure frequency nonambiguously with one differential delay, a nonambiguous delay $\tau_{nonamb}$ must be chosen such that it is equal to or less than $1/f_{max}$, where $f_{max}$ is a maximum frequency to which the phase receiver will be subjected. To reduce the number of ambiguities in a practical multi-channel IFM receiver, as shown in FIG. 2, the input signal 20 is translated to an IF frequency band by a frequency converter 24 to limit $f_{max}$. Such a configuration operates on input signals 20 in one frequency band at a time, and switches local oscillators within the frequency converter 24 to change bands. A typical IF band is about 2–4 Ghz, and thus $f_{max}$ is typically about 4 Ghz.

Figure 3:
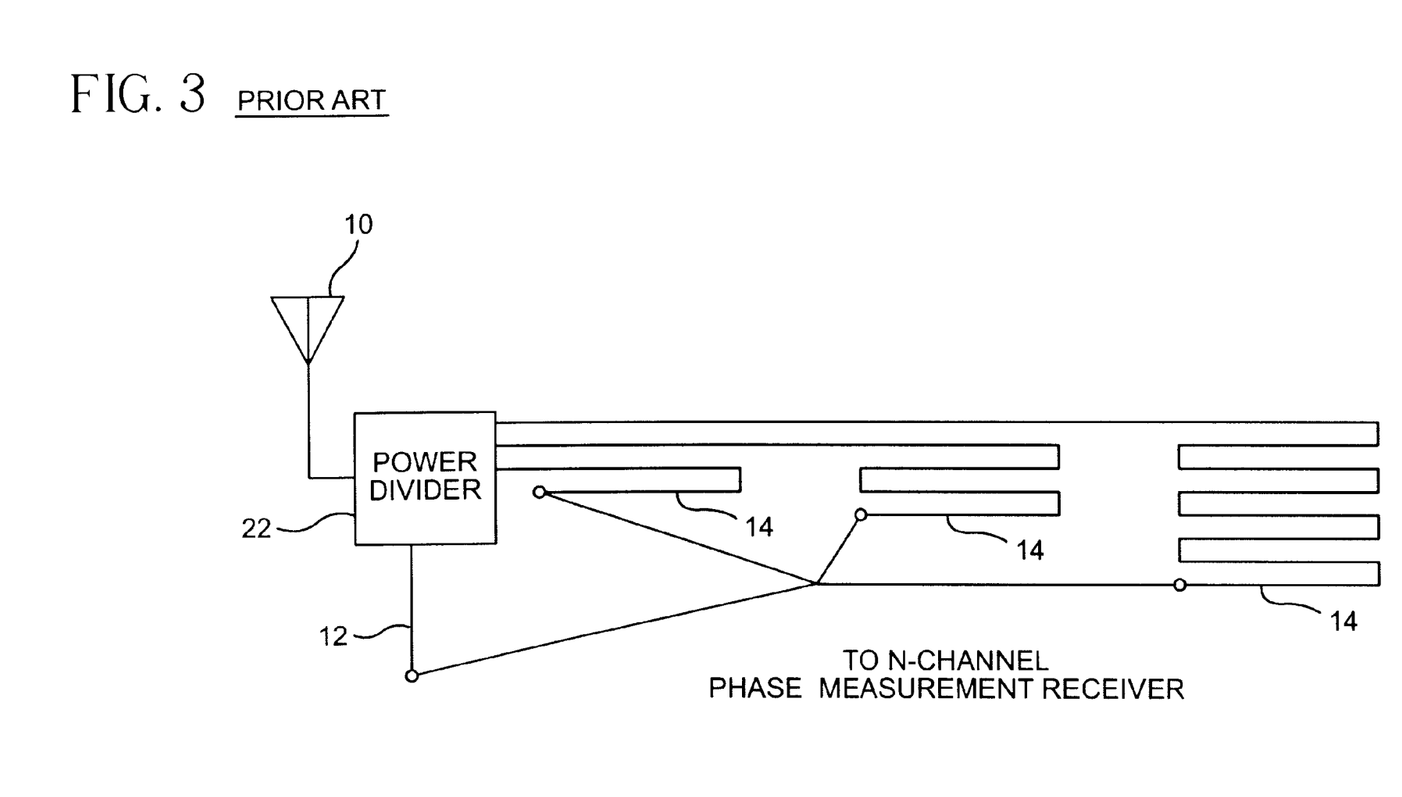
FIG. 3 is a block diagram of an antenna, a power divider and delay lines configured in conventional lengths forming binary ratios.

To resolve ambiguities, IFM receivers commonly perform a second nonambiguous measurement using delay lines configured in binary ratios such as 1, 2, 4 and 8 as shown in FIG. 3. The nonambiguous delay $\tau_{nonamb}$ is the shortest delay used in such a Binary IFM receiver (BIFM), and it produces unambiguous estimates for the most significant frequency bit. The next differential delay is twice the nonambiguous delay $\tau_{nonamb}$. This next differential delay produces a frequency estimate with twice the accuracy, which is used for the next most significant frequency bit, and it can have one ambiguity which can be resolved with the prior nonambiguous delay $\tau_{nonamb}$. This process can be continued in binary fashion by adding additional differential delays, each twice as long as the preceding one, so that the length of the ith delay is given by equation (5) as follows:

$$\tau^{BIFM}_i = 2^{(i-1)}/(f_{max}), \quad (5)$$

and a frequency estimation error $\Delta f^{BIFM}$ of the ith delay for the BIFM is given by equation (6) as follows:

$$\Delta f^{BIFM}_i = f_{max}(\epsilon/360)(\frac{1}{2}^{(i-1)}), \quad (6)$$

where $$i = 1 + \text{ceil}\{\log(\epsilon f_{max}/360\Delta f^{BIFM})\}/\log(2), \quad (7)$$

and ceil refers to a "ceiling" function which outputs the next integer greater than its operand. For instance, ceil (5.2)=6, ceil (11.3)=12, ceil (10.5)=11, and so forth.

Thus, for the frequency error $\Delta f$ of no more than 5 MHZ with a phase receiver having a phase measurement error $\epsilon$ equal to 7.2 degrees and a maximum frequency equal to 4 Ghz, i must be at least 5. That is, the BIFM must have at least a six channel phase receiver with one reference delay line and five differential delay lines.

BIFM receivers have also been implemented with delay lines differing in length by a factor of 4 rather than 2 as described above. Such receivers require fewer delay lines. For instance, using the example above, only 3 differential delay lines are required for the frequency error $\Delta f$ equal to 5 MHZ.

The quantity of delay lines required depends upon the accuracy desired for the frequency measurement. However, the cost and complexity of IFM receivers increases as the number of delay lines increases. Thus, it would be advantageous if the number of delay lines required to achieve a given accuracy in frequency measurement could be reduced from that required by conventional BIFM receivers without substantially degrading the accuracy of the frequency measurement.

OBJECTS AND SUMMARY OF THE INVENTION

It is an object of the present invention to provide an Instantaneous Frequency Measurement (IFM) receiver for calculating a frequency of input signals using fewer delay lines to achieve a given accuracy than conventional IFM receivers.

It is a further object of the present invention to provide an IFM receiver, which is less costly and complex to manufacture and smaller than conventional IFM receivers.

It is yet a further object of the present invention to provide an IFM receiver which requires fewer channels from an N-channel phase receiver to achieve a given accuracy than conventional IFM receivers.

It is another object of the present invention to provide a method of selecting delay lines in IFM receivers which minimizes the quantity of delay lines required to achieve a given accuracy in measuring frequency.

In accordance with one form of the present invention, an IFM receiver is provided, which receives input signals from a target and determines the frequency of the signals. The IFM receiver includes delay lines configured in lengths which either forms relatively prime ratios, or which are selected according to the following relationship:

$$\tau_n = ((360/4\epsilon) - 1)^{n-1}(1/f_{max}), \quad (17)$$

where $\tau$ is the delay associated with a delay line in seconds, n is an integer indexing variable greater than or equal to 1 which refers to a particular delay line, $\epsilon$ is a phase measurement error, and $f_{max}$ is a maximum frequency to which an n-channel phase receiver will be subjected. The input signal is fed to the delay lines, which provide delayed versions of the input signals to separate channels of an N-channel phase receiver. The N-channel phase receiver determines phase information representing phase difference between the delayed versions of the input signal. The output of the N-channel phase receiver is provided to a phase translation circuit, which translates the phase information into frequency information indicative of the frequency of the signal from the target.

Previously, IFM receivers included delay lines configured in binary ratios. By implementing an IFM receiver with delay lines configured in lengths according to the relationships provided above, substantially the same accuracy can be achieved with fewer delay lines. A reduction in delay lines reduces the cost, complexity and size of the IFM receiver.

In accordance with another form of the present invention, methods of selecting delay lines in IFM receivers is provided. The methods are based on delays which either selected in relatively prime ratios, or are selected according to the following relationship:

$$\tau_n((360/4\epsilon) - 1)^{n-1}(1/f_{max}), \quad (17)$$

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENTS

Figure 4A:
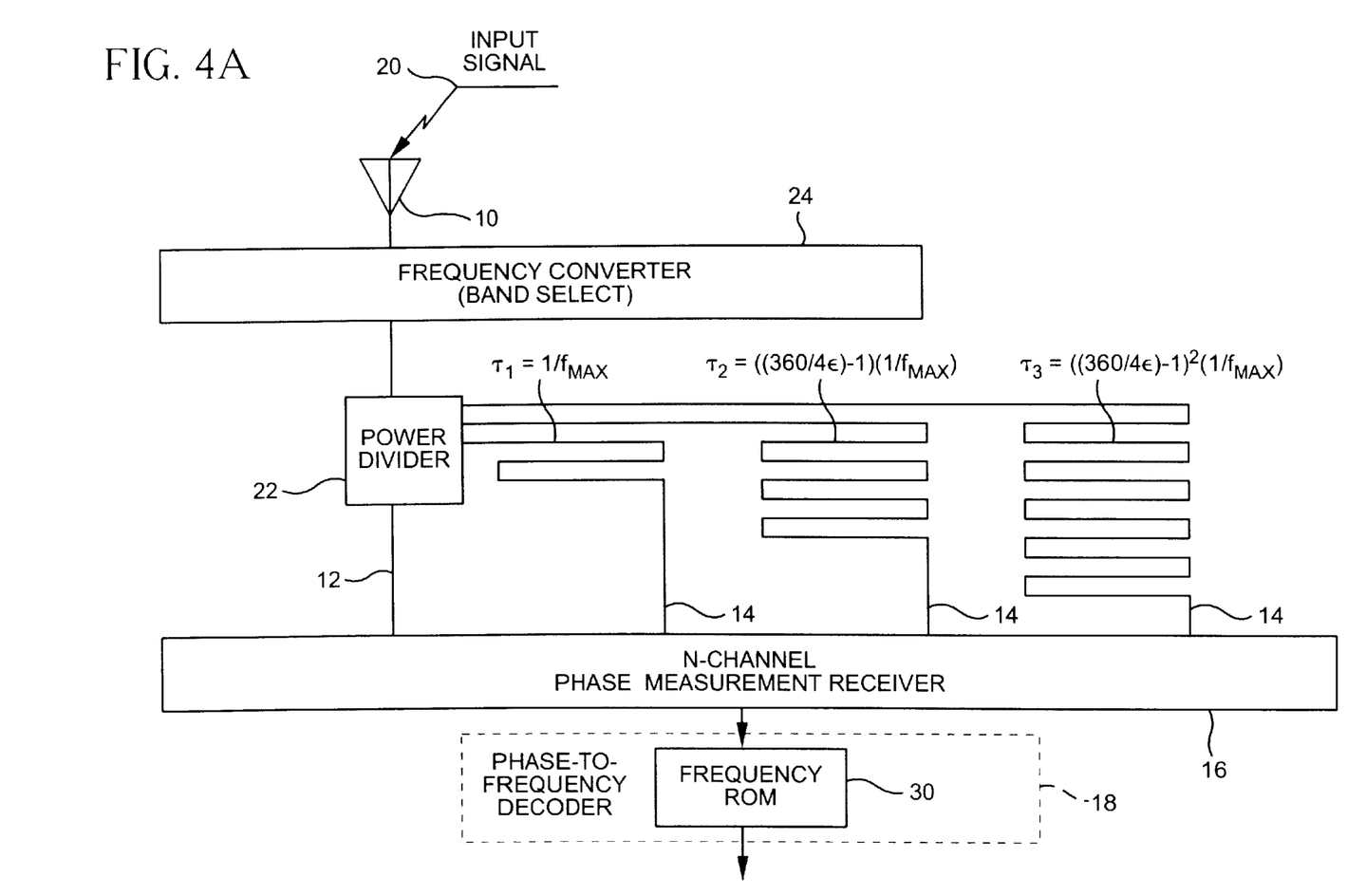
FIG. 4A is a block diagram of an IFM receiver having delay lines selected by using a preferred method in accordance with the present invention.
Figure 4B:
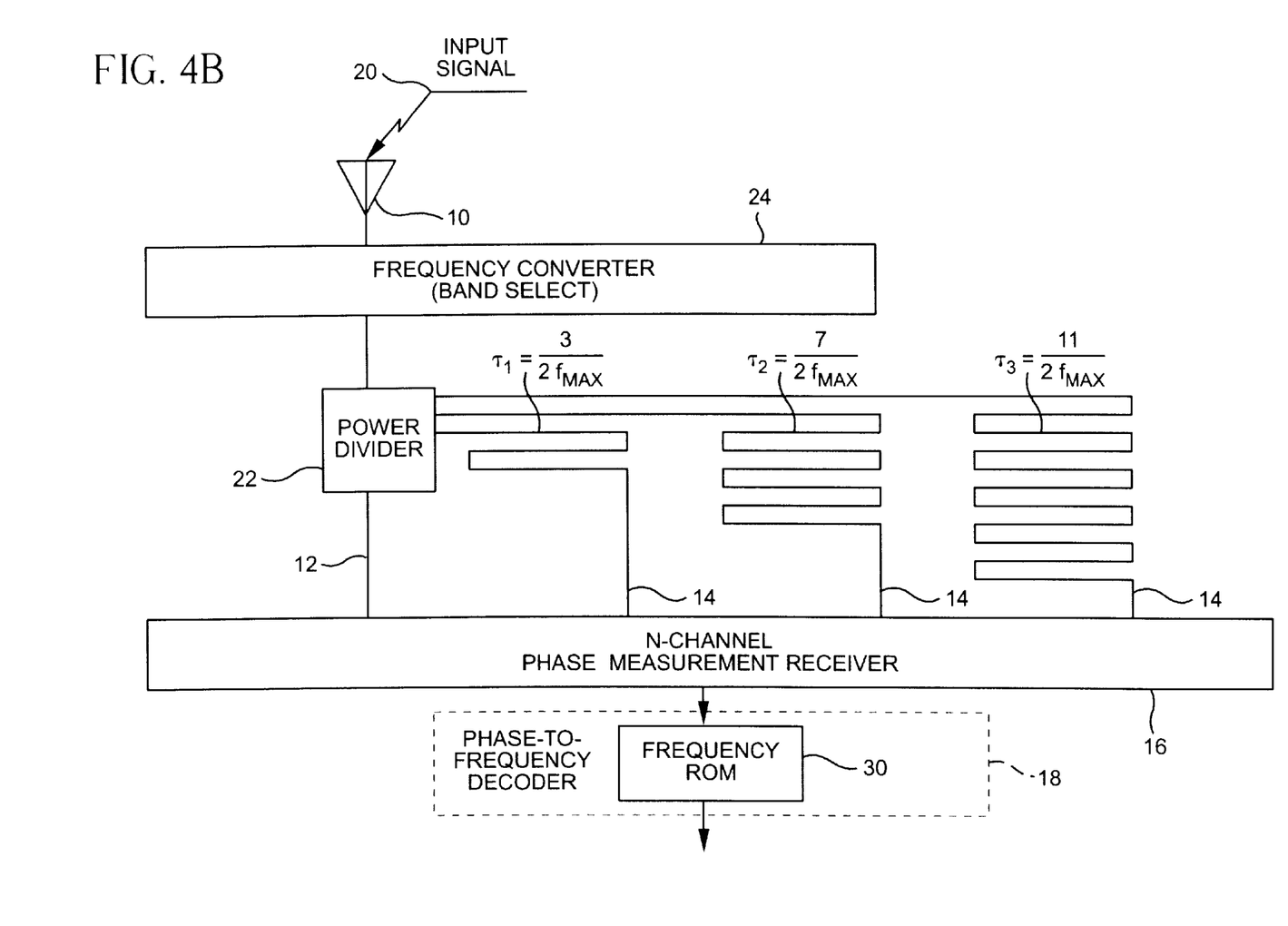
FIG. 4B is a block diagram of an IFM receiver having delay lines selected in lengths forming relatively prime ratios in accordance with the present invention.

FIGS. 4A and 4B are block diagrams of an Instantaneous Frequency Measurement (IFM) receiver, which determines a frequency of an input signal 20 using delay lines 12, 14 configured in lengths determined by methods in accordance with the present invention. The IFM receiver includes an antenna 10, a frequency converter 24, a power divider 22, the delay lines 12 and 14, an N-channel phase measurement receiver 16, and a phase-to-frequency decoder 18.

During frequency measurement, the input signal 20 is received by the antenna 10 and fed to the frequency converter 24. The frequency converter 24 essentially functions to down-convert the received input signals 20 from different bands to an intermediate frequency (IF) by means well known in the art. Further detail regarding the frequency converter 24 and other superheterodyne concepts is provided in R. C. Dorf, *Electrical Engineering Handbook,* IEEE Press, (1993), pp. 1367–1404, which is incorporated herein by reference.

Referring again to FIGS. 4A and 4B, the down-converted IF signal from the frequency converter 24 is fed to the power divider 22, which splits the IF signal among the delay lines 12, 14. The delay lines 12, 14 terminate in distinct inputs of the N-channel phase measurement receiver 16.

The present invention is directed to two methods of determining delays in IFM receivers to minimize the total quantity of lengths required to achieve a given accuracy in frequency measurement, as well as IFM receivers which incorporate delay lines selected in accordance with these methods. The delay lines 12, 14 shown in FIG. 4B are configured in lengths forming relatively prime ratios including delays corresponding to 3, 7 and 11 half wavelengths at a maximum value of the intermediate frequency. Delay lines 12, 14 configured in accordance with the preferred method of the present invention are shown in FIG. 4A, and are selected according to a relationship to be described in greater detail below. Such configurations are not practiced in the prior art of IFM receivers. The configuration of delay lines in FIGS. 4A and 4B require fewer delays to achieve a given accuracy of frequency measurement than the binary configuration of delay lines illustrated in FIG. 3. The lengths of the delay lines 12, 14 illustrated in FIGS. 1–3, 4A and 4B are not drawn to any particular scale, proportion or ratio but are merely intended as illustrative examples without limiting the scope of the present invention.

Referring again to FIGS. 4A and 4B, the phase-to-frequency decoder 18 converts phase information calculated by the N-channel phase receiver 16 to frequency information. The phase information is preferably used to address a frequency read-only memory (ROM) 30 in the phase-to-frequency decoder 18. The data in the address of the frequency ROM 30 pointed to by the phase information represents the frequency of the input signal 20 corresponding to the phase information. This data is outputted from the phase-to-frequency decoder 18, and corresponds to frequency information representative of the frequency of the input signal 20.

To resolve ambiguities in frequency measurement created by using only two delay lines, of an IFM receiver, an additional measurement is typically required. There are two possibilities for this second measurement. Either the second measurement of frequency is made with a delay difference that results in a nonambiguous frequency estimate, or the second measurement results in ambiguous frequencies which are non-overlapping with those of the first set. The conventional binary delay ratio configuration uses the nonambiguous frequency measurement method. The present invention defines one embodiment using the nonambiguous frequency measurement method, and one embodiment using the non-overlapping ambiguous frequency method.

The preferred method for selecting delay line lengths of the present invention uses the longest possible ambiguous delay with one or more nonambiguous shorter delays. This method results in the fewest number of delay lines for a given accuracy in frequency measurement.

To measure frequency nonambiguously, a nonambiguous delay $\tau_{nonamb}$ must be shorter than an ambiguous delay $\tau_{amb}$. In particular, $\tau_{nonamb} \leq 1/f_{max}$, where $f_{max}$ is the highest frequency to which an IFM receiver is subjected. This restriction in differential delays limits the accuracy of frequency measurement that can be obtained with the nonambiguous delay. Nevertheless, the frequency determination error is usually small enough to allow ambiguity resolution even if the length of the ambiguous delay $\tau_{amb}$ is much more than double that of the nonambiguous delay $\tau_{nonamb}$. Consequently, with the longer ambiguous delay $\tau_{amb}$, fewer delays are needed than in the case of a Binary IFM (BIFM) receiver of the prior art, for a given accuracy in frequency.

The strategy used to resolve ambiguities in the high accuracy measurement is to match the frequency indicated by the nonambiguous measurement with one of the frequencies indicated by the ambiguous measurement. However, it is unlikely that the frequencies indicated by the two measurements will exactly match due to the uncertainty in both measurements. To solve this dilemma, a match is required within a statistical tolerance rather than a strict equality. Only the frequency indicated that is nearest to the actual frequency must be within this tolerance. In other words, the nearest non-true (ambiguous) frequency, indicated must lie outside this tolerance.

Figure 5:
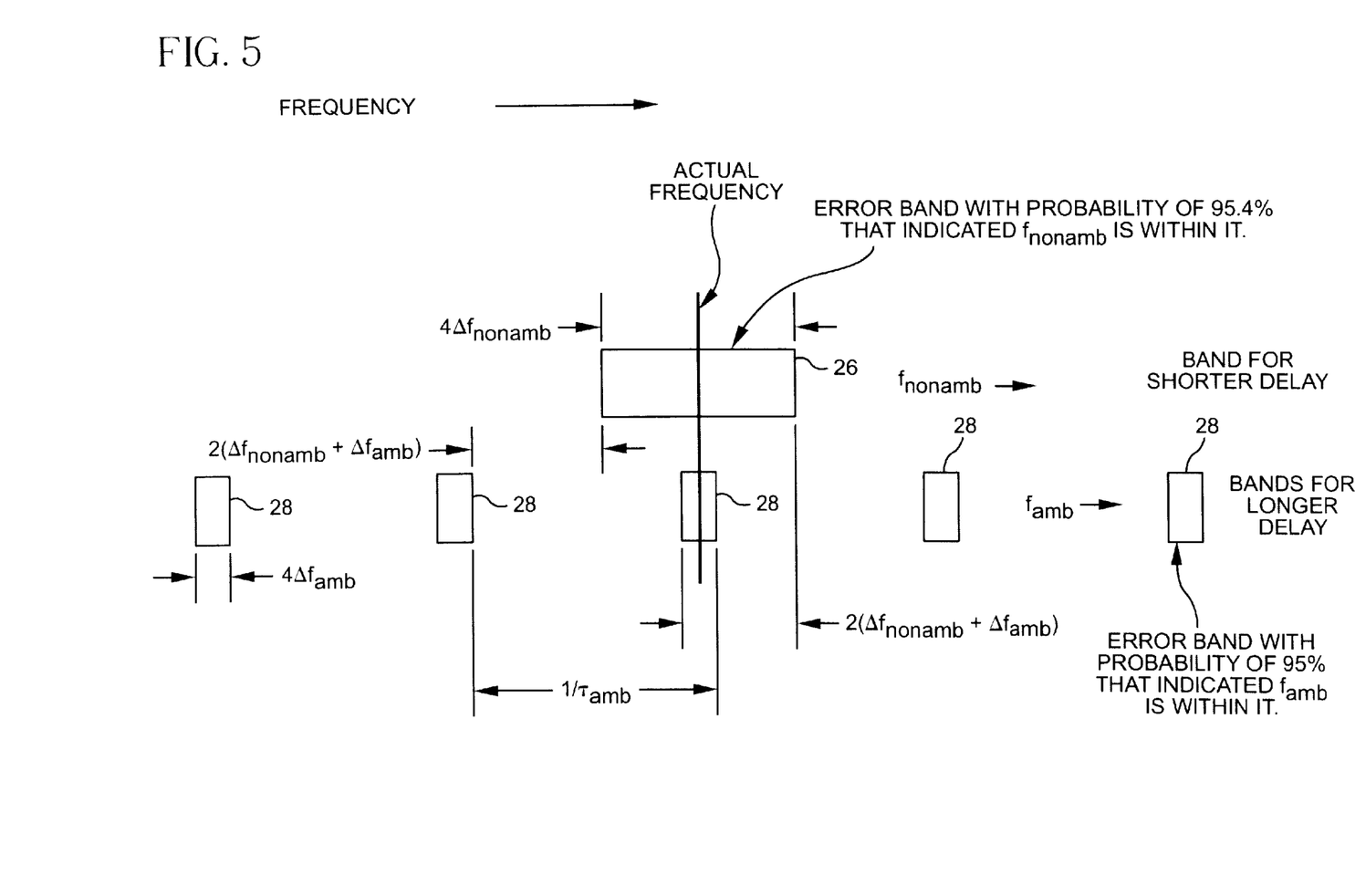
FIG. 5 is a pictorial representation of a frequency spectrum showing the determination of frequency using delays selected in accordance with the preferred method of the present invention.

The method of setting the statistical tolerance can be understood by referring to FIG. 5. The limited accuracy of measurement causes the frequency indicated to be shifted randomly from the actual frequency, with the probability of the amount of shift decreasing with the amount of shift in accordance with a Gaussian probability distribution. In FIG. 5, an uncertainty band 26 is defined that contains the frequency indicated from the shorter, nonambiguous delay with 95.4% probability. This band is centered about the actual frequency and has a width of ±2 standard deviations, or $4\Delta f_{nonamb}$ where $\Delta f_{nonamb}$ is a frequency error obtained from the nonambiguous delay $\tau_{nonamb}$. Similarly, multiple uncertainty bands 28 are defined for the longer, ambiguous delay, each with a width of $4\Delta f_{amb}$, where $\Delta f_{amb}$ is a frequency error obtained from the ambiguous delay $\tau_{amb}$. One uncertainty band 28 for the longer, ambiguous delay is centered about the actual frequency. The tolerance for the match can be set to the frequency spread between the lower frequency edge of the band 28 for the longer, ambiguous delay, and the upper frequency edge of the band 26 for the shorter, nonambiguous delay. This spread is given by $2(\Delta f_{nonamb} + \Delta f_{amb})$.

A joint probability that the frequency indicated with the shorter, nonambiguous delay is greater than that indicated by the upper edge of its band 26, and that the frequency indicated with the longer, ambiguous delay is less than that indicated by the edge of its band 28, is equal to the probability that the match will not be achieved. However, this joint probability is simply equal to the product of the individual probabilities. The probability that the frequency indicated with the shorter, nonambiguous delay is greater than that indicated by the upper edge of its band 26 is (100−95.4)/2, or 2.3%. The probability that the frequency indicated with the longer, ambiguous delay is less than that indicated by the edge of its band 28 is also 2.3%. Therefore, the probability that the match will not be achieved within this tolerance is equal to the product of these probabilities or 0.05%.

Likewise, using this same matching tolerance, it could be made even more unlikely (less than 0.05% probable) that the nearest incorrect frequency indicated by the longer, ambiguous delay was matched rather than the actual frequency. Such a low probability can be achieved through selection of $\tau_{amb}$, since $1/\tau_{amb}$ is the spacing of ambiguous frequencies indicated by the longer, ambiguous delay. This spacing is set according to inequality (8) as follows:

$$1/\tau_{amb} \geq 4(\Delta f_{nonamb} + \Delta f_{amb}). \tag{8}$$

With this spread between ambiguities, the spacing of the upper edge of the uncertainty band of the nearest incorrect frequency from the lower edge of the band of the shorter, nonambiguous delay is greater than or equal to the matching tolerance (i.e., greater than or equal to $2(\Delta f_{nonamb} + \Delta f_{amb})$), and thus a low probability of obtaining an incorrect match is ensured.

The relationship between $\tau$ and $\Delta f$ values is given by the following equations:

$$\Delta f_{nonamb} \geq f_{max}(\epsilon/360)(1/\tau_{nonamb}), \tag{9}$$

$$\Delta f_{amb} \geq f_{max}(\epsilon/360)(\tau_{amb}). \tag{10}$$

Therefore, $$4(\Delta f_{nonamb} + \Delta f_{amb}) = 4(\epsilon/360)(1/\tau_{nonamb} + 1/\tau_{amb}), \tag{11}$$

and thus the relationship in inequality (8) above becomes the following:

$$1/\tau_{amb} \geq 4(\epsilon/360)(1/\tau_{nonamb} + 1/\tau_{amb}). \tag{12}$$

Solving the inequality (11) for $\tau_{amb}$ yields the following:

$$\tau_{amb} \leq ((360/4\epsilon) - 1)\tau_{nonamb} = ((360/4\epsilon) - 1)(1/f_{max}). \tag{13}$$

Thus, combining equations (10) and (13) yield:

$$\Delta f_{amb} \geq f_{max}(\epsilon/360)^2 / ((\frac{1}{4}) - (\epsilon/360)). \tag{14}$$

Thus, if $\epsilon = 7.2$ degrees and $f_{max} = 4$ Ghz, then $\Delta f_{amb} = 7$ MHZ and $\tau_{amb} = 2.875$ ns.

If greater accuracy is required, another ambiguous measurement must be made with a third, still longer delay. The ambiguities of the third delay are resolved by measurements with the first two delays. Re-applying the rules above, a second ambiguous delay $\tau_{2amb}$ must be chosen in accordance with the following relationships:

$$\tau_{2amb} \leq ((360/4\epsilon) - 1)\tau_{amb} = ((360/4\epsilon) - 1)^2(1/f_{max}), \tag{15}$$

and $$\Delta f_{2amb} \geq f_{max}(\epsilon/360)^3 / ((\frac{1}{4}) - (\epsilon/360))^2. \tag{16}$$

Thus, if $\epsilon = 7.2$ degrees and $f_{max} = 4$ Ghz, then $\Delta f_{2amb} = 0.5$ MHZ and $\tau_{amb} = 33$ ns.

If further accuracy is required, additional ambiguous measurements must be made with longer delays. From the method described above, it can be seen that the lengths of the delays are exponentially related, with the length of the nth delay being given by equation (17) as follows:

$$\tau_n = ((360/4\epsilon) - 1)^{n-1}(1/f_{max}). \tag{17}$$

The frequency estimation error of the nth delay is given by the following equation:

$$\Delta f_n = (\epsilon/360)^n f_{max} / ((\frac{1}{4}) - (\epsilon/360))^{(n-1)}. \tag{18}$$

An alternative method for selecting delays of the present invention uses delays which are all ambiguous, but that are relatively prime. Fortunately, through proper selection of the delays, it is possible to align only those readings within a predetermined measurement accuracy around the actual frequency, and thus to resolve the ambiguities. A shortest delay $\tau_1$ is chosen as N times $1/f_{max}$. The next shortest delay $\tau_2$ is chosen as M times $1/f_{max}$. To ensure that only one solution is in the frequency range below $f_{max}$, N and M must be relatively prime or form a relatively prime ratio, that is, M/N cannot be an integer. For example, if M and N are chosen to be integers, one relationship yielding relatively prime values of M and N is as follows:

$$M = kN + 1, \tag{19}$$

where k is an integer greater than or equal to 1.

Figure 6:
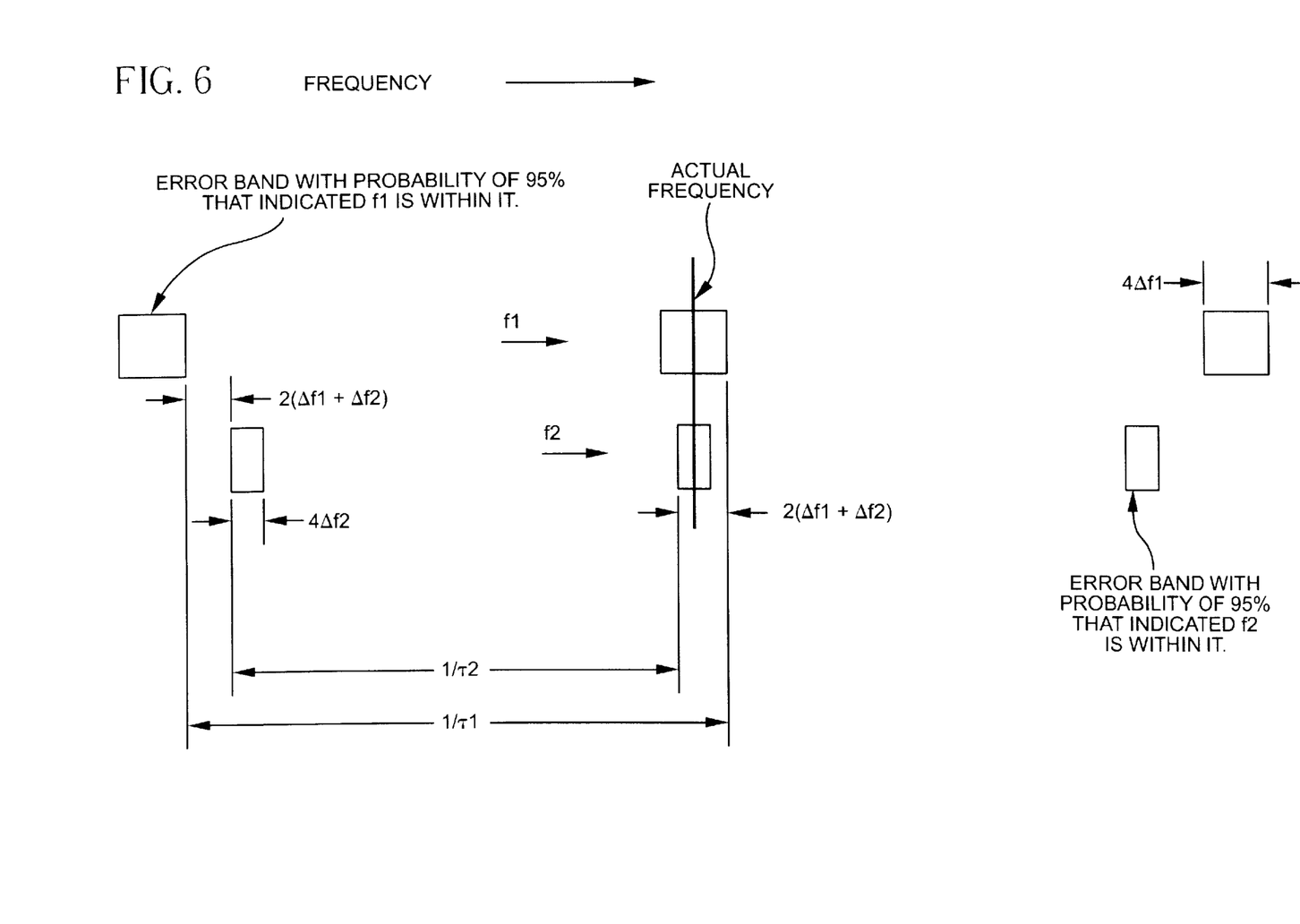
FIG. 6 is a pictorial representation of the frequency spectrum showing the determination of frequency using delays selected in relatively prime ratios in accordance with the present invention where k=1.

The optimum value of k depends on $\epsilon$. As discussed above, the smallest allowable spacing between ambiguous indicated frequencies is generally equal to the frequency matching tolerance, that is, the spacing is greater than or equal to $2(\Delta f1 + \Delta f2)$, where $\Delta f1$ and $\Delta f2$ are the errors (standard deviations) in the frequencies indicated by measurements with the first and second delays, respectively. Therefore, summing the spacings, as shown in FIG. 6 for k=1, yields the following:

$$2(\Delta f1 + \Delta f2) + (1/\tau 2) + 2(\Delta f1 + \Delta f2) \leq (1/\tau 1). \tag{20}$$

Substituting $(\epsilon/360)(1/\tau 1)$ for $\Delta f1$ and $(\epsilon/360)(1/\tau 2)$ for $\Delta f2$ yields the following:

$$4(\epsilon/360)((1/\tau 1) + (1/\tau 2)) \leq (1/\tau 1) - (1/\tau 2), \tag{21}$$

which has the following solution:

$$\tau 1/\tau 2 = (1 - 4\epsilon/360)/(1 + 4\epsilon/360). \tag{22}$$

However, $\tau 1/\tau 2$ is also equal to N/M or in this case, N/(N+1). Therefore, substituting N/(N+1) into equation (22) above with algebraic manipulation yields the following:

$$N \leq (((1 + 4\epsilon/360)(1 - 4\epsilon/360)^{-1}) - 1)^{-1} \tag{23}$$

Thus, for $\epsilon = 7.2$ degrees, $N \leq 5.75$, $M = 6.75$ (or $N \leq 5$ and $M \leq 6$ if N and M are limited to integers). For $f_{max} = 4$ Ghz, $\tau 2 \leq 1.438$ ns (or 1.25 ns, if M=6). Therefore, the error $\Delta f2 \geq 13.9$ MHZ (16 MHz for M=6).

Figure 7:
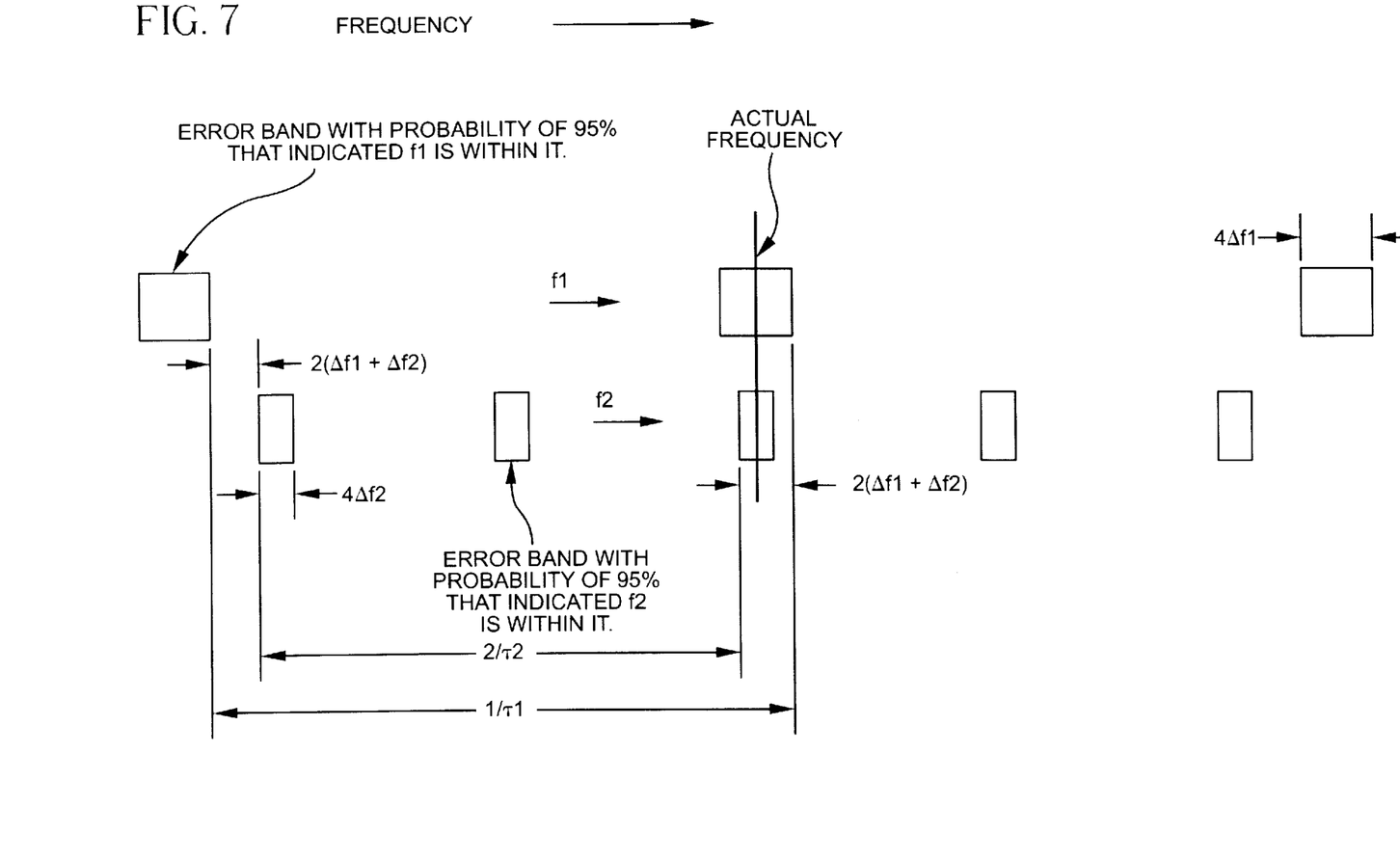
FIG. 7 is a pictorial representation of the frequency spectrum showing the determination of frequency using delays selected in relatively prime ratios in accordance with the present invention where k=2.

Similarly, summing the spacings, as shown in FIG. 7 for k=2, yields the following:

$$2(\Delta f1 + \Delta f2) + (2/\tau 2) + 2(\Delta f1 + \Delta f2) \leq (1/\tau 1). \tag{24}$$

Solving this as above results in the following:

$$N \leq (((2 + 4\epsilon/360)(1 - 4\epsilon/360)^{-1}) - 2)^{-1} \tag{25}$$

Thus, for $\epsilon = 7.2$ degrees, $N \leq 3.833$, $M = 8.66$ (or $N \leq 3$, $M \leq 7$ if N and M are limited to integers). For $f_{max} = 4$ Ghz, $\tau 2 \leq 2.1666$ ns (or 1.75 ns, if M=6). The error $\Delta f2 \leq 9.2$ MHZ (11.4 MHz for M=6).

In the same manner, if M=kN+1, the solution for N is as follows:

$$N \leq (((k + 4\epsilon/360)(1 - 4\epsilon/360)^{-1}) - k)^{-1} \tag{26}$$

Table 1 below summarizes the error $\Delta f2$ for k=1 to 10, $f_{max} = 4$ Ghz and $\epsilon = 7.2$ degrees when N and M are restricted to integers.

TABLE 1

| k | N | M | Δf2 MHZ |
|---|---|---|---------|
| 1 | 5 | 6 | 13.3 |
| 2 | 3 | 7 | 11.4 |
| 3 | 2 | 7 | 11.4 |
| 4 | 2 | 9 | 8.9 |
| 5 | 1 | 6 | 13.3 |
| 6 | 1 | 7 | 11.4 |
| 7 | 1 | 8 | 10.0 |
| 8 | 1 | 9 | 8.9 |
| 9 | 1 | 10 | 8.0 |
| 10 | 1 | 11 | 7.25 |

Table 1 shows that if N and M are limited to integer values, k=4 is a local optimum for the assumed values of $\epsilon$ and $f_{max}$. As k is increased further, one of the delays is nonambiguous, and the other gradually reaches the limiting value found in the preceding discussion of the nonambiguous preferred method of the present invention. Likewise, as k is increased, the accuracy of the relatively prime or ambiguous method gradually reaches the 7 MHz limiting value found with the nonambiguous preferred method. It is notable that the accuracy achieved by the alternative ambiguous method is always less than the preferred nonambiguous method for all values of k.

Table 2 summarizes the error Δf2 for k=1 to 5, $f_{max}$=4 Ghz and $\epsilon$=7.2 for noninteger values of N and M.

TABLE 2

| k | N | M | Δf2 MHZ |
|---|---|---|---------|
| 1 | 5.75 | 6.75 | 11.8 |
| 2 | 3.833 | 8.666 | 9.2 |
| 3 | 2.875 | 9.625 | 8.1 |
| 4 | 2.3 | 10.2 | 7.8 |
| 5 | 1.916 | 10.58 | 7.6 |

Table 2 shows that, as k gets larger, the accuracy of the ambiguous method with non-integer values of N and M monotonically approaches that of the preferred nonambiguous method. However, the accuracy of the ambiguous method never exceeds the error $\Delta f_{amb}$=7 MHZ found with the preferred nonambiguous method of the present invention.

Thus, the IFM receiver of the present invention calculates the frequency of input signals using delay lines configured in lengths selected by methods in accordance with the present invention that minimize the total quantity of delay lines required to achieve a given accuracy of frequency measurement. By virtue of the particular configuration of delays, the IFM receiver is less costly and complex to manufacture, occupies less space and requires fewer channels of a phase receiver than IFM receivers of comparable accuracy utilizing delays configured in lengths selected using conventional methods.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A device for measuring a frequency of a received signal comprising:

a plurality of delay lines, each of the delay lines being responsive to the received signal and delaying the received signal by a different delay time, the delay time being one of equal to zero and greater than zero, each of the delay lines outputting a delayed signal; and a phase receiver, the phase receiver including channels, each of the channels being responsive to one of the delayed signals, the phase receiver measuring a phase difference between selected delayed signals, the phase receiver generating an output signal corresponding to the phase difference, the phase difference being representative of the frequency of the received signal, at least a first delay $\tau_1$ being selected such that $\tau_1=N/f_{max}$, at least a second delay $\tau_2$ being selected such that $\tau_2=M/f_{max}$, where M and N are positive integers and M/N is a non-integer, $f_{max}$ being a maximum frequency which the phase receiver will see.

2. A device for measuring a frequency of a received signal as defined by claim 1, further comprising a frequency converter responsive to the received signal, the frequency converter converting the received signal to a signal having a frequency different from the received signal, the frequency converter generating an output signal, the plurality of delay lines being responsive to the output signal of the frequency converter.

3. A device for measuring a frequency of a received signal as defined by claim 1, further comprising a power divider responsive to the received signal, the power divider dividing the received signal into signals substantially similar to the received signal, the power divider generating output signals, each of the delay lines being responsive to at least one of the output signals of the power divider.

4. A device for measuring a frequency of a received signal as defined by claim 1, further comprising a phase-to-frequency decoder responsive to the output signal of the phase receiver, the phase-to-frequency decoder converting the output signal of the phase receiver to the frequency of the received signal.

5. A device for measuring a frequency of a received signal comprising:

a plurality of delay lines, each of the delay lines being responsive to the received signal and delaying the received signal by a different predetermined delay time, each of the delay lines outputting a delayed signal; and a phase receiver, at least two of the delay lines having delays $\tau_n$ selected according to a relationship as follows:

$$\tau_n=((360/4\epsilon)-1)^{n-1}(1/f_{max}),$$

where n is an integer indexing variable equal to or greater than 1 which individually references at least two of the delay lines, $\epsilon$ is a phase measurement error of the phase receiver, and $f_{max}$ is a maximum frequency which the phase receiver will see, the phase receiver including channels, each of the channels being responsive to one of the delayed signals, the phase receiver measuring a phase difference between selected delayed signals, the phase receiver generating an output signal corresponding to the phase difference, the phase difference representative of the frequency of the received signal.

6. A device for measuring a frequency of a received signal as defined by claim 5, further comprising a frequency converter responsive to the received signal, the frequency converter converting the received signal to a signal having a frequency different from the received signal, the frequency converter generating an output signal, the plurality of delay lines being responsive to the output signal of the frequency converter.

7. A device for measuring a frequency of a received signal as defined by claim 5, further comprising a power divider responsive to the received signal, the power divider dividing the received signal into signals substantially similar to the received signal, the power divider generating output signals, each of the delay lines being responsive to at least one of the output signals of the power divider.

8. A device for measuring a frequency of a received signal as defined by claim 5, further comprising a phase-to-frequency decoder responsive to the output signal of the phase receiver, the phase-to-frequency decoder converting the output signal of the phase receiver to the frequency of the received signal.

9. A method of selecting delays in a frequency measurement device including a phase receiver to reduce a quantity of delay lines, the method comprising the steps of:

selecting a first delay $\tau_1$ such that $\tau_1 = N/f_{max}$; and selecting at least a second delay $\tau_2$ such that $\tau_2 = M/f_{max}$, M and N are positive integers, and M/N is a non-integer, $f_{max}$ being a maximum frequency which the phase receiver will see.

10. A method of selecting delays in a frequency measurement device including a phase receiver to reduce a quantity of delay lines as defined by claim 9, wherein M=kN+1, where k is an integer greater than or equal to 1.

11. A method of selecting delays in a frequency measurement device including a phase receiver to reduce a quantity of delay lines as defined by claim 10, wherein N is selected according to a relationship as follows:

$$N \leq \frac{1}{k + \frac{\frac{4\varepsilon}{360}}{1 - \frac{4\varepsilon}{360}} - k}$$

where k is an integer greater than or equal to 1, and $\varepsilon$ is a measurement error of the phase receiver.

12. A method of selecting delays in a frequency measurement device including a phase receiver to reduce a quantity of delay lines as defined by claim 9, wherein the first delay $\tau_1$ and the second delay $\tau_2$ are selected according to a relationship as follows:

$$\tau_1/\tau_2 = (1 - 4\varepsilon/360)/(1 + 4\varepsilon/360),$$

where $\varepsilon$ is a phase measurement error of the phase receiver.

13. A method of selecting delays in a frequency measurement device including a phase receiver to reduce a quantity of delay lines required to achieve a predetermined accuracy of frequency measurement, the method comprising the steps of:

selecting a first delay $\tau_1$ such that $\tau_1 = 1/f_{max}$; and selecting at least one subsequent delay $\tau_n$ according to the relationship:

$$\tau_n = ((360/4\varepsilon) - 1)^{n-1}(1/f_{max}),$$

where n is an integer indexing variable equal to or greater than 2 which individually references the subsequent delays, $\varepsilon$ is a phase measurement error of the phase receiver, and $f_{max}$ is a maximum frequency which the phase receiver will see.

* * * * *